(12) United States Patent
Righetti et al.

(10) Patent No.: US 11,776,629 B2
(45) Date of Patent: Oct. 3, 2023

(54) THRESHOLD VOLTAGE BASED ON PROGRAM/ERASE CYCLES

(71) Applicant: Micron Technology, Inc., Boise, ID (US)

(72) Inventors: Niccolo' Righetti, Boise, ID (US); Kishore K. Muchherla, Fremont, CA (US); Jeffrey S. McNeil, Jr., Nampa, ID (US); Akira Goda, Boise, ID (US); Todd A. Marquart, Boise, ID (US); Mark A. Helm, Santa Cruz, CA (US); Gil Golov, Backnang (DE); Jeremy Binfet, Boise, ID (US); Carmine Miccoli, Boise, ID (US); Giuseppina Puzzilli, Boise, ID (US)

(73) Assignee: Micron Technology, Inc., Boise, ID (US)

(*) Notice: Subject to any disclaimer, the term of this patent is extended or adjusted under 35 U.S.C. 154(b) by 96 days.

(21) Appl. No.: 16/995,517

(22) Filed: Aug. 17, 2020

(65) Prior Publication Data

US 2022/0051722 A1 Feb. 17, 2022

(51) Int. Cl.
*G11C 16/10* (2006.01)
*G11C 16/14* (2006.01)

(52) U.S. Cl.
CPC .............. *G11C 16/10* (2013.01); *G11C 16/14* (2013.01)

(58) Field of Classification Search
CPC .................... G11C 16/10; G11C 16/14
USPC ....................................... 365/185.24
See application file for complete search history.

(56) References Cited

U.S. PATENT DOCUMENTS

| | | | |
|---|---|---|---|
| 7,593,259 B2 | 9/2009 | Kim | |
| 7,692,970 B2 | 4/2010 | Park et al. | |
| 8,036,044 B2 | 10/2011 | Dong et al. | |
| 8,995,197 B1 | 3/2015 | Steiner | |
| 9,047,955 B2 | 6/2015 | Cometti et al. | |
| 9,514,823 B2 | 12/2016 | Melik-Martirosian | |
| 9,857,992 B2 | 1/2018 | Pangal et al. | |
| 2012/0117313 A1* | 5/2012 | Sarin | G06F 12/0246 711/E12.008 |
| 2013/0080691 A1 | 3/2013 | Weingarten | |
| 2015/0113207 A1 | 4/2015 | Shin | |
| 2022/0029641 A1* | 1/2022 | Kale | H03M 13/2906 |

* cited by examiner

*Primary Examiner* — Jason Lappas
(74) *Attorney, Agent, or Firm* — Brooks, Cameron & Huebsch, PLLC

(57) ABSTRACT

A method includes during a first portion of a service life of a memory device, programming at least one memory cell of the memory device to a first threshold voltage corresponding to a desired data state. The method can include during a second portion of the service life of the memory device subsequent to the first portion of the service life of the memory device, programming at least one memory cell of the memory device to a second threshold voltage corresponding to the desired data state. The second threshold voltage can be different than the first threshold voltage.

16 Claims, 7 Drawing Sheets

---

DURING A FIRST PORTION OF A SERVICE LIFE OF A MEMORY DEVICE, PROGRAM AT LEAST ONE MEMORY CELL OF THE MEMORY DEVICE TO A FIRST $V_t$ CORRESPONDING TO A DESIRED DATA STATE — 638

DURING A SECOND PORTION OF THE SERVICE LIFE OF THE MEMORY DEVICE SUBSEQUENT TO THE FIRST PORTION OF THE SERVICE LIFE OF THE MEMORY DEVICE, PROGRAM AT LEAST ONE MEMORY CELL OF THE MEMORY DEVICE TO A SECOND $V_t$ CORRESPONDING TO THE DESIRED DATA STATE, WHEREIN THE SECOND $V_t$ IS GREATER THAN THE FIRST $V_t$ — 640

THRESHOLD VOLTAGE BASED ON PROGRAM/ERASE CYCLES

TECHNICAL FIELD

Embodiments of the disclosure relate generally to memory systems and more specifically relate to determining threshold voltage based on program/erase cycles (PEC).

BACKGROUND

A memory system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
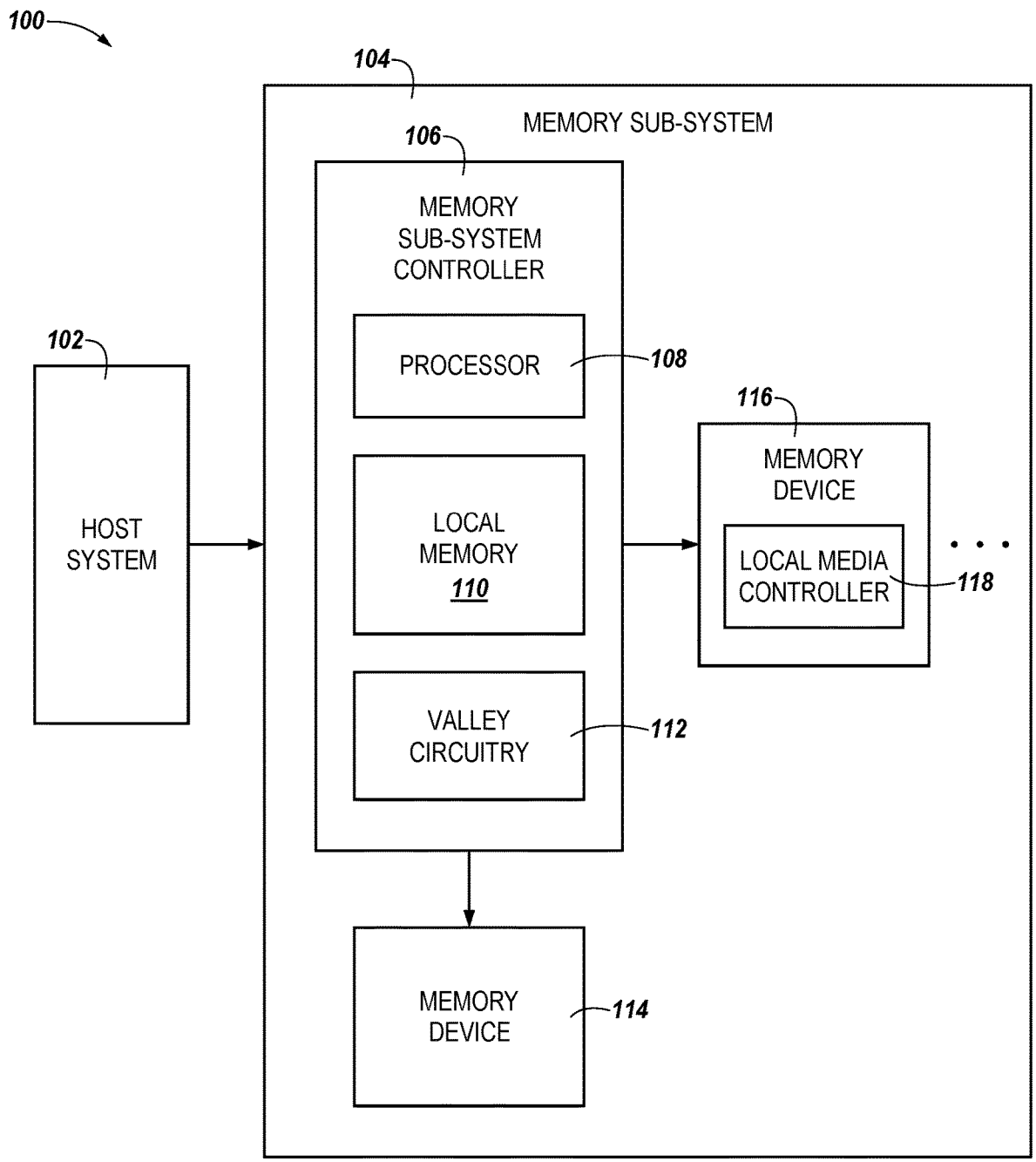
FIG. 1 illustrates an example computing system that includes a memory sub-system in accordance with some embodiments of the present disclosure.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices, such as memory devices that store data. The host system can provide data to be stored at the memory sub-system and can request data to be retrieved from the memory sub-system.

Aspects of the present disclosure are directed to changing a magnitude of a threshold voltage ($V_t$) to which at least one memory cell of a memory sub-system is programmed based on a remaining service life of the memory sub-system.

A vehicle can include a memory sub-system, such as a solid state drive (SSD). The memory sub-system can be used for storage of data by various components of the vehicle, such as applications that are run by a host system of the vehicle. One example of such an application is an event recorder of the vehicle. An event recorder can also be referred to as a "black box" or accident data recorder. Data can be stored by the event recorder for different portions of a service life of the event recorder. As used herein, "service life" refers to a measure of an intended or designed use of a memory sub-system or memory device. The service life of a memory sub-system or memory device can be described by an amount of time. As an illustrative example only, the service life of a memory sub-system or memory device can be two years. The service life of a memory sub-system or memory device can be described by a quantity of PEC undergone by the memory sub-system and/or memory device. As an illustrative example only, the service life of a memory sub-system or memory device can be hundreds of thousands of PEC.

The emergence of autonomous vehicles, Internet of Things (IoT) and surveillance devices has resulted in a wider gap in between the total bytes written (TBW) in a useable lifetime of a memory sub-system and a user capacity of the memory sub-system. For example, the TBW to user capacity ratio for some memory systems used for such applications has increased by one to three orders of magnitude. Some autonomous vehicles require real time buffering of telemetric data such as video cameras, radar, lidar, ultra-sonic and other sensors that are necessary to playback the sequences preceding an accident. The data from various sensors sums up to a substantial throughput requirement per unit time (e.g., 1 gigabyte per second (GB/sec) sequential write throughput from a host). Upon a trigger event, a quantity of data corresponding to a predetermined playback time immediately preceding the event needs to be captured (e.g., to determine the cause of an accident). The recorded telemetric sensor data corresponding to the predetermined playback time can be referred to as a "snapshot". An event recorder is one such application in where the user capacity requirement could be as low as one hundred and twenty-eight (128) GB, but the TBW requirement could be as high as hundreds of Peta Bytes. The examples of values given are not limiting but highlight the relative difference between the requirements for capacity and TBW. An event recorder may need to store at least a few, most recent snapshots. A performance target for storage for the event recorder is significant write performance for large TBW where data retention is important because the memory cells will be subject to many program/erase cycles (PEC), which can cause memory cells to degrade.

Aspects of the present disclosure address the above and other storage challenges for memory sub-systems that can be used as event recorders by change a magnitude of $V_t$ based on a remaining service life of a memory sub-system to improve a data retention capability and/or an endurance capability of a memory sub-system. A memory sub-system can have a cyclic buffer portion to store data for short portions of the service life of the memory sub-system and a snapshot portion to store data for longer portions of the service life of the memory sub-system. The memory sub-system can have a performance target of data retention. As such, it can be beneficial to change a magnitude of $V_t$ based on a remaining service life of the memory sub-system to improve a data retention capability and/or an endurance capability of the memory sub-system.

FIG. 1 illustrates an example computing system 100 that includes a memory sub-system 104 in accordance with some embodiments of the present disclosure. The memory sub-system 104 can include media, such as one or more volatile memory devices 114, one or more non-volatile memory devices 116, or a combination thereof. The volatile memory device 114 can be, but is not limited to, random access memory (RAM), such as dynamic random access memory (DRAM), synchronous dynamic random access memory (SDRAM), and resistive DRAM (RDRAM).

A memory sub-system 104 can be a storage device, a memory module, or a hybrid of a storage device and memory module. Examples of a storage device include an SSD, a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a desktop computer, laptop computer, network server, mobile device, a vehicle (e.g., airplane, drone, train, automobile, or other conveyance), IoT enabled device, embedded computer (e.g., one included in a vehicle, industrial equipment, or a networked commercial device), or similar computing system that includes memory and a processing device.

The computing system 100 includes a host system 102 that is coupled to one or more memory sub-systems 104. In some embodiments, the host system 102 is coupled to different types of memory sub-systems 104. FIG. 1 illustrates an example of a host system 102 coupled to one memory sub-system 104. In at least one embodiment, the host system 102 is a computing device that controls a vehicle, such as an autonomous vehicle, and the memory sub-system 104 is an SSD that provides event recorder storage for the vehicle. For example, the memory sub-system 104 can store time based telemetric sensor data for the vehicle. Time based telemetric sensor data is defined in more detail with respect to FIG. 9. Embodiments are not limited to this example. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 102 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, etc.). The host system 102 uses the memory sub-system 104, for example, to write data to the memory sub-system 104 and read data from the memory sub-system 104.

The host system 102 can be coupled to the memory sub-system 104 via a physical host interface. Examples of a physical host interface include, but are not limited to, a serial advanced technology attachment (SATA) interface, a PCIe interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 102 and the memory sub-system 104. The host system 102 can further utilize an NVM Express (NVMe) interface to access the non-volatile memory device 116 when the memory sub-system 104 is coupled with the host system 102 by the PCIe interface. The physical host interface can provide an interface for passing control, address, data, and other signals between the memory sub-system 104 and the host system 102. FIG. 1 illustrates a memory sub-system 104 as an example. In general, the host system 102 can access multiple memory sub-systems via a same communication connection, multiple separate communication connections, and/or a combination of communication connections.

The host system 102 can send requests to the memory sub-system 104, for example, to store data in the memory sub-system 104 or to read data from the memory sub-system 104. The data to be written or read, as specified by a host request, is referred to as "host data." A host request can include logical address information. The logical address information can be a logical block address (LBA), which may include or be accompanied by a partition number. The logical address information is the location the host system associates with the host data. The logical address information can be part of metadata for the host data. The LBA may also correspond (e.g., dynamically map) to a physical address, such as a physical block address (PBA), that indicates the physical location where the host data is stored in memory.

An example of non-volatile memory devices 116 include not-and (NAND) type flash memory. NAND type flash memory includes, for example, two-dimensional NAND (2D NAND) and three-dimensional NAND (3D NAND). The non-volatile memory device 116 can be another types of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (0xRAM), negative-or (NOR) flash memory, electrically erasable programmable read-only memory (EEPROM), and three-dimensional cross-point memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Each of the non-volatile memory device 116 can include one or more arrays of memory cells. One method of operating a memory cell includes storing one-bit per cell, which is referred to as a single level cell (SLC) mode. A memory cell operating in a particular mode can be referred to by that mode. For example, a memory cell operated in a SLC can be referred to as an SLC. The "level" refers to the quantity of states to which the cell is programmed, other than an erased state (level). An SLC can be programmed to one level other than the erased level. Other methods of operating memory cells include storing more than one bit per cell, such as multi-level cells (MLCs), triple level cells (TLCs), quad-level cells (QLCs), and penta-level cells (PLCs), among others. As used herein, "multi-level cells" refer to memory cells configured to store more than one bit per cell. In some embodiments, the non-volatile memory device 116 can include one or more arrays of memory cells, which can include SLCs, MLCs, TLCs, QLCs, or combinations thereof. In some embodiments, a particular memory device can include an SLC portion, and an MLC portion, a TLC portion, a QLC portion, or a PLC portion of memory cells. The memory cells of the non-volatile memory device 116 can be grouped as pages that can refer to a logical unit of the memory device used to store data. With some types of memory (e.g., NAND), pages can be grouped to form blocks.

The memory sub-system controller 106 (or controller 106 for simplicity) can communicate with the non-volatile memory device 116 to perform operations such as reading data, writing data, erasing data, and other such operations at the non-volatile memory device 116. The memory sub-system controller 106 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 106 can be a microcontroller, special purpose logic circuitry (e.g., a field programmable gate array (FPGA), an application specific integrated circuit (ASIC), etc.), or other suitable circuitry.

The memory sub-system controller 106 can include a processing device 108 (e.g., a processor) configured to execute instructions stored in local memory 110. In the illustrated example, the local memory 110 of the memory sub-system controller 106 is an embedded memory configured to store instructions for performing various processes, operations, logic flows, and routines that control operation of the memory sub-system 104, including handling communications between the memory sub-system 104 and the host system 102.

In some embodiments, the local memory 110 can include memory registers storing memory pointers, fetched data, etc. The local memory 110 can also include ROM for storing micro-code, for example. While the example memory sub-system 104 in FIG. 1 has been illustrated as including the memory sub-system controller 106, in another embodiment of the present disclosure, a memory sub-system 104 does not include a memory sub-system controller 106, and can instead rely upon external control (e.g., provided by an external host, or by a processor or controller separate from the memory sub-system 104).

In general, the memory sub-system controller 106 can receive information or operations from the host system 102 and can convert the information or operations into instructions or appropriate information to achieve the desired access to the non-volatile memory device 116 and/or the volatile memory device 114. The memory sub-system controller 106 can be responsible for other operations such as wear leveling operations, error detection and/or correction operations, encryption operations, caching operations, and address translations between a logical address (e.g., an LBA) and a physical address (e.g., an PBA) associated with the non-volatile memory device 116. The memory sub-system controller 106 can further include host interface circuitry to communicate with the host system 102 via the physical host interface. The host interface circuitry can convert a query received from the host system 102 into a command to access the non-volatile memory device 116 and/or the volatile memory device 114 as well as convert responses associated with the non-volatile memory device 116 and/or the volatile memory device 114 into information for the host system 102.

In some embodiments, the non-volatile memory device 116 includes a local media controller 118 that operates in conjunction with memory sub-system controller 106 to execute operations on one or more memory cells of the non-volatile memory device 116. An external controller (e.g., memory sub-system controller 106) can externally manage the non-volatile memory device 116 (e.g., perform media management operations on the memory device 116). In some embodiments, a memory device 116 is a managed memory device, which is a raw memory device combined with a local controller (e.g., local controller 118) for media management within the same memory device package. An example of a managed memory device is a managed NAND device.

The memory sub-system controller 106 can also include valley circuitry 112. The valley circuitry 112 can comprise an ASIC configured to perform the examples described herein. In some embodiments, a local media controller 118 of a non-volatile memory device 116 includes at least a portion of the valley circuitry 112. For example, the local media controller 118 can include a processor (e.g., processing device) configured to execute instructions stored on the memory device 114 for performing the operations described herein with respect to the valley circuitry 112. In some embodiments, the valley circuitry 112 is part of the host system 102, an application, or an operating system.

The valley circuitry 112 can be configured to cause at least one memory cell of the non-volatile memory device 116 to be programmed to a $V_t$ where a magnitude of the $V_t$ is based on a remaining service life of the non-volatile memory device 116 and/or the memory sub-system 104. For example, during a portion of a service life of the non-volatile memory device 116, one or more memory cells of the non-volatile memory device 116 can be programmed to a $V_t$ corresponding to a desired data state. During a subsequent portion of the service life of the non-volatile memory device 116, one or more memory cells of the non-volatile memory device 116 can be programmed to a greater $V_t$ corresponding to the desired data state. As used herein, "target voltage" refers to a voltage to which a memory cell is intended to be programmed whereas "threshold voltage ($V_t$)" refers to a voltage to which a memory cell is programmed. In some embodiments, the valley circuitry 112 can issue or cause to be issued a set trim command, which causes the non-volatile memory device 116 (or portions thereof) to use a particular set of operating parameters to operate the memory cells of the non-volatile memory device 116. Target voltages can be associated with various operations such as program (write), program verify, erase, erase verify, and sense (read), among other operations associated with an array of memory cells. Target voltages can be used to achieve or adjust a valley (the voltage spread) between different $V_t$ distributions for different data states for memory cells of the non-volatile memory device 116.

The valley circuitry 112 can execute instructions to selectively vary a magnitude of a target voltage corresponding to a particular data state based on a quantity of PEC that the non-volatile memory device 116 has undergone. The valley circuitry 112 can execute instructions to, responsive to the quantity of PEC being at most a particular value, program one or more memory cells of the non-volatile memory device 116 to a $V_t$ corresponding to the particular data state and, responsive to the quantity of PEC being greater than the particular value, program one or more memory cells of the non-volatile memory device 116 to a greater $V_t$ corresponding to the particular data state. The valley circuitry 112 can execute instructions to, throughout a service life of the non-volatile memory device 116, increase a read window of one or more memory cells of the non-volatile memory device 116 based on the quantity of PEC that the non-volatile memory device 116 has undergone. A magnitude of a target voltage corresponding to a different data state can be static throughout the service life of the non-volatile memory device 116. The magnitude of the target voltage corresponding to the particular data state can be dynamic such that the magnitude of the target voltage is increased based on the quantity of PEC that the memory device has undergone. The valley circuitry 112 can execute instructions to program one or more memory cells of the non-volatile memory device 116 such that one or more memory cells of the non-volatile memory device 116 remains at a $V_t$ corresponding to an erased state, and one or more memory cells of the memory device is programmed to a different $V_t$ corresponding to a programmed state. A magnitude of the $V_t$ can be static throughout a service life of the non-volatile memory device 116. A magnitude of the different $V_t$ can be increased, over the service life of the non-volatile memory device 116, based on the quantity of PEC that the non-volatile memory device 116 has undergone.

Figure 2:
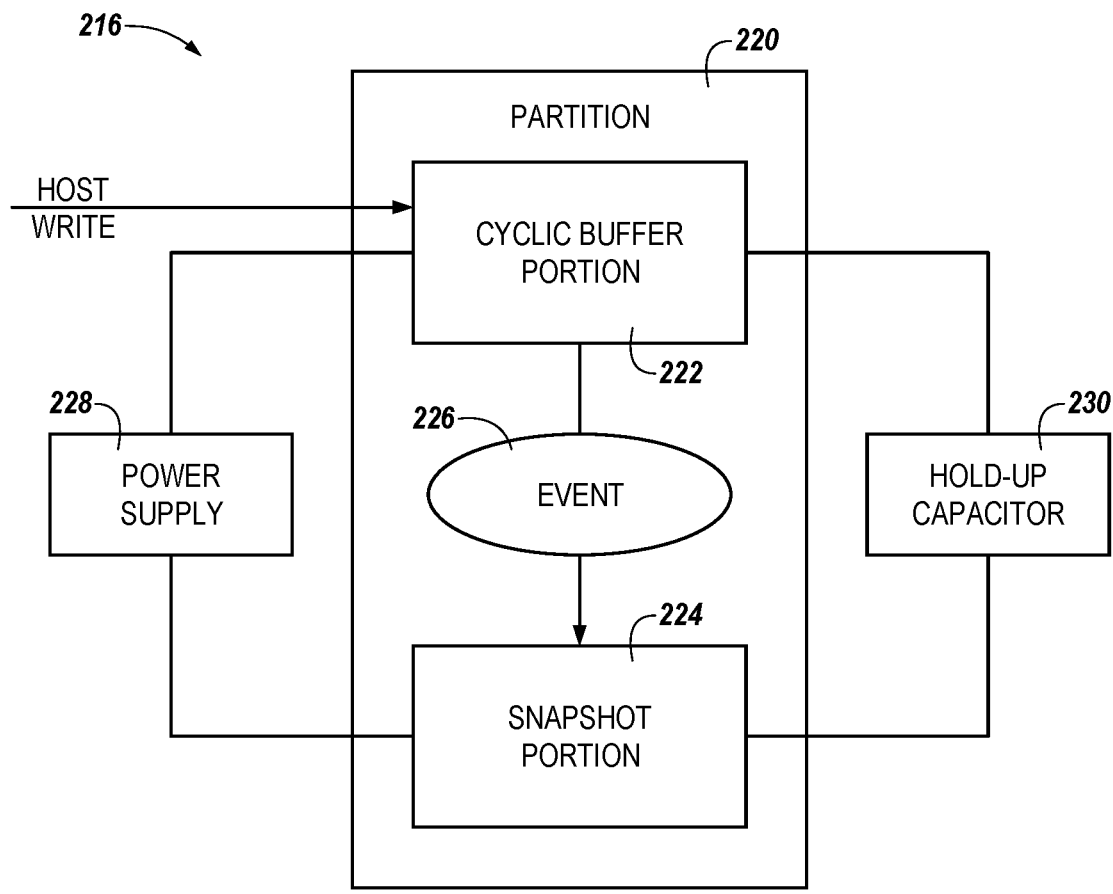
FIG. 2 illustrates an example of a partition including a cyclic buffer portion and a snapshot portion within a memory device in accordance with some embodiments of the present disclosure.

In at least one embodiment of the present disclosure, the non-volatile memory device 116 can include a cyclic buffer portion (e.g., the cyclic buffer portion 222 illustrated by FIG. 2) and a snapshot portion (e.g., the snapshot portion 224 illustrated by FIG. 2). The valley circuitry 112 can execute instructions to selectively vary the magnitude of the target voltage corresponding to the particular data state based on a quantity of PEC that the snapshot portion has undergone. The valley circuitry 112 can execute instructions to selectively vary the magnitude of the target voltage corresponding to the particular data state based on the quantity of PEC that the cyclic buffer portion has undergone to improve an endurance capability of the cyclic buffer portion over a service life of the non-volatile memory device 116. The valley circuitry 112 can execute instructions to selectively vary the magnitude of the target voltage corresponding to the particular data state based on the quantity of PEC that the snapshot portion has undergone to improve data retention of the snapshot portion over a service life of the non-volatile memory device 116.

The memory sub-system 104 can also include additional circuitry or components that are not illustrated. In some embodiments, the memory sub-system 104 can include a cache or buffer (e.g., DRAM) and address circuitry (e.g., a row decoder and a column decoder) that can receive an address from the memory sub-system controller 114 and decode the address to access the volatile memory device 114 and/or the non-volatile memory device 116.

FIG. 2 illustrates an example of a partition 220 including a cyclic buffer portion 222 and a snapshot portion 224 within a memory device 216 in accordance with some embodiments of the present disclosure. The cyclic buffer portion 222 and snapshot portion 224 can be reserved portions of the partition 220. Host data can be received by the memory sub-system. The host data can be time based telemetric sensor data from different sensors of a vehicle. The time based telemetric sensor data from the different sensors can be aggregated by the host and sent to the memory sub-system at a data rate. The host data can be received by the memory sub-system and stored in the cyclic buffer portion 222 of the non-volatile memory device 216. As the cyclic buffer portion 222 is filled with host data, new data received from the host is stored sequentially, but older data in the cyclic buffer portion 222 can be erased or overwritten. The cyclic buffer portion 222 can therefore operate as a first-in-first-out (FIFO) buffer, where newly received data replaced the oldest data therein.

The cyclic buffer portion 222 can be coupled to the snapshot portion 224. Upon occurrence of a trigger event 226, an amount of the time based telemetric sensor data from the cyclic buffer portion 222 can be copied to the snapshot portion 224. The amount of host data corresponding to a defined period of time, which may be referred to as a playback time (e.g., 30 seconds), is referred to as a snapshot size and the data itself over that defined period of time is referred to as a snapshot. The snapshot size can be pre-defined for a period of time immediately preceding a trigger event. The snapshot size and/or playback time can be a predefined value programmed to the memory sub-system by a manufacturer, supplier, or user of the memory sub-system. In some embodiments, the determination that the trigger event 226 has occurred can include actuation of a trigger signal based at least in part upon received sensor information from a host that is above a threshold, such as a quantitative value.

The cyclic buffer portion 222 can store significantly more data over the service life of the memory device 216 than the snapshot portion 224. For example, the cyclic buffer portion 222 can store 3-4 orders of magnitude (1,000-10,000 times) more data than the snapshot portion 224. However, the cyclic buffer portion 222 does not have to have a larger storage capacity than the snapshot portion 224. The size (amount of memory) of the cyclic buffer portion 222 can be dependent, at least in part, on an endurance capability of the cyclic buffer portion 222. For example, if a host is expected to write 150 petabytes (PB) of data to the cyclic buffer portion 222 (TBW is 150 PB) and the endurance capability of the cyclic buffer portion 222 is 5 million PEC, then 30 GB of memory for the cyclic buffer portion 222 is sufficient to satisfy the TBW of 150 PB, provided that data stored by the cyclic buffer portion 222 is overwritten. In contrast, if the endurance capability of the cyclic buffer portion 222 is 500 thousand PEC, then 300 GB of memory for the cyclic buffer portion 222 is necessary to satisfy the TBW of 150 PB. Thus, it can be beneficial to improve (increase) an endurance capability of the non-volatile memory device 216 (e.g., an endurance capability of the cyclic buffer portion 222) so that a higher TBW requirement can be satisfied with a smaller amount of memory. Reducing the amount of memory can reduce manufacturing costs, operating costs, and/or improve performance of the non-volatile memory device 216.

The size (amount of memory) of the snapshot portion 224 can be based on the rate at which data is to be received from the host, a playback time, and a quantity of snapshots that are desired to be available in the snapshot portion 224. The snapshot portion 224 can have sufficient storage to save [data rate from host (e.g., in GB/sec)*playback time (e.g., in sec)*desired quantity of snapshots (e.g., a whole number)]. In other words, the size of the snapshot portion 224 can be sufficiently large to store a desired number of snapshots. As used herein, the size of the snapshot portion 224 is referred to as "a user capacity" of the memory sub-system.

The memory sub-system can be configured to operate the cyclic buffer portion 222 such that memory cells of the cyclic buffer portion 222 are programmed to a $V_t$ based on a remaining service life of the memory sub-system. It is desirable for the cyclic buffer portion 222 to store data accurately and reliably because the cyclic buffer portion 222 is used repeatedly and frequently (in some embodiments, significantly more frequently than the snapshot portion 224). Thus, a performance target of the cyclic buffer portion 222 can be endurance capability.

The memory sub-system can be configured to operate the snapshot portion 224 such that memory cells of the snapshot portion 224 are programmed to a $V_t$ based on a remaining service life of the memory sub-system. It is desirable for the snapshot portion 224 to store data accurately and reliably because the snapshots are intended to be recoverable after a trigger event. Thus, a performance target of the snapshot portion 224 can be data retention.

The copying of a snapshot from the cyclic buffer portion 222 to the snapshot portion 224 can be powered by a power supply 228 of the memory sub-system under normal circumstances. However, copying of the snapshot from the cyclic buffer portion 222 to the snapshot portion 224 can be powered by a backup power supply, such as one or more hold-up capacitors 230 in response to a loss of system power (e.g., the power supply 228), which can be associated with the trigger event 226, such as a vehicle accident. In at least one embodiment, the loss of power from the power supply 228 can be the trigger event 226. A size and/or quantity of the hold-up capacitor(s) 230 are sufficient to provide enough power to copy one snapshot from the cyclic buffer portion 222 to the snapshot portion 224. As illustrated, the power supply 228 and the hold-up capacitor 230 are coupled to the cyclic buffer portion 222 and the snapshot portion 224. This indicates that the power supply 228 and the hold-up capacitor 230 are coupled to the memory device 216 to provide power therefor. There may not be a direct physical connection between either the power supply 228 or the hold-up capacitor 230 and the partition 220, but the power can be provided through write circuitry (not specifically illustrated).

In some embodiments, memory cells of the cyclic buffer portion 222 can be operated so as to store one bit per cell (SLC mode) and memory cells of the snapshot portion 224 can be operated so as to store more than one bit per cell. It can take longer to operate memory cells that store more than one bit per cell than to operate memory cells that store only one bit per cell. For example, an increased number of data states represented by the memory cells having multiple bits per cell can further increase complexity of an algorithm associated with programming, reading, and/or erasing the memory cells. Therefore, the memory cells programmed to store multiple bits per cell can have a different programming characteristic, such as a slower data transfer rate and/or longer programming time (e.g., time elapsed to program data to the memory cells), than that of the SLC memory cells and/or memory cells programmed to store fewer bits per cell. Memory cells of the cyclic buffer portion 222 can be operated with a faster programming time than a programming time for the memory cells of the snapshot portion 224.

Figure 3B:
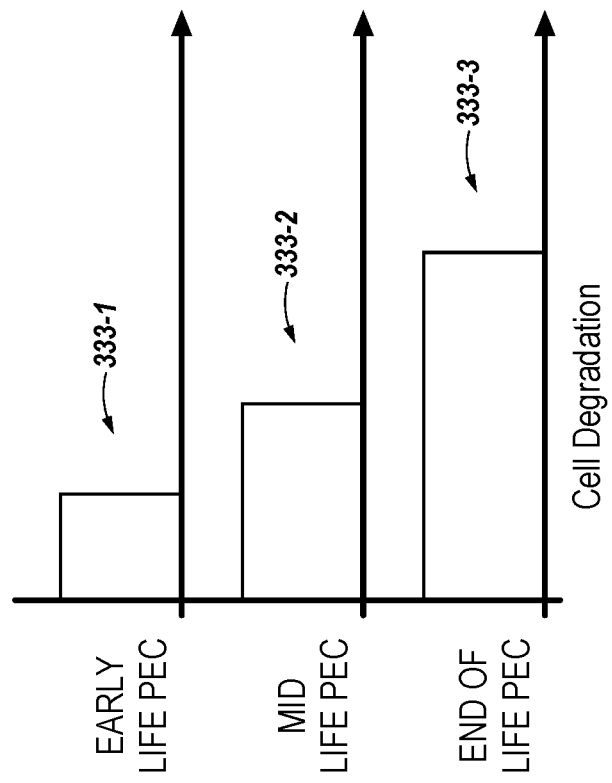
FIG. 3B illustrates graphical representations of degradation of memory cells in accordance with some embodiments of the present disclosure.
Figure 3A:
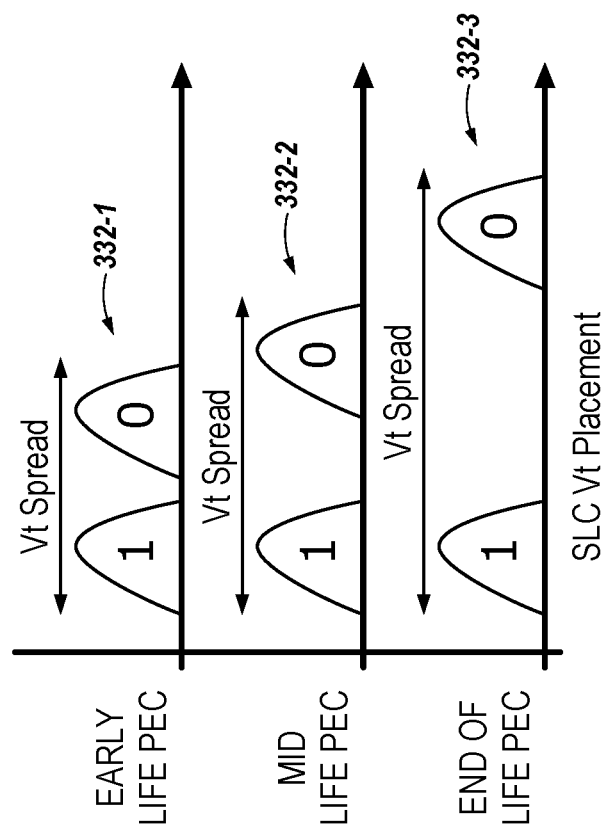
FIG. 3A illustrates different read windows in accordance with some embodiments of the present disclosure.

FIG. 3A illustrates different read windows 332-1, 332-2, and 332-3 in accordance with some embodiments of the present disclosure. Although not specifically labeled as such, the horizontal axis represents the charge or voltage of the memory cell ($V_t$) and the vertical axis represents the quantity of memory cells for each data state (1 and 0) that are programmed to a particular voltage. The curves for each data state (1 and 0) therefore represent statistical distributions of memory cell threshold voltages for each data state. The arrows indicating the "$V_t$ spread" (threshold voltage spread) indicate the separation between the $V_t$ distributions along the horizontal axis (e.g., in volts). The $V_t$ spread is also referred to as a read window.

Some non-volatile memory devices can have a performance target of increased data retention requirements early in the service life of the non-volatile memory device and reduced data retention requirements at the end of the service life of the non-volatile memory device. Some non-volatile memory devices have increased data retention requirements early in the service life for workloads with reduced write traffic and data backup applications for when a non-volatile memory device is powered off. Embodiments of the present disclosure can support workloads with increased write traffic.

Memory cells of a non-volatile memory device can be in good condition early in the service life of the non-volatile memory device. Because the memory cells are in good condition, large valley margins are not required. Thus, the non-volatile memory device can utilize a narrow read window, such as the read window 332-1, without negatively affecting the reliability of the non-volatile memory device. Utilizing a narrow $V_t$ spread can slow down degradation of memory cells of the non-volatile memory device, which, in turn, can increase the endurance and data retention performance of the non-volatile memory device.

FIG. 3A provides a graphical representation of programming memory cells of a non-volatile memory device to a $V_t$ based on a quantity of PEC that the non-volatile memory device has undergone. Early in the service life of the non-volatile memory device, memory cells of the non-volatile memory device can be programmed to threshold voltages illustrated by the read window 332-1. The read window 332-1 is narrow such that the $V_t$ distribution associated with a data state (e.g., an erased state (1)) is close to the $V_t$ distribution associated with a different data state (e.g., a programmed state (0)). A narrower $V_t$ spread between data states can reduce the data reliability because it can be more difficult to distinguish between the data states. But because the memory cells are in good condition early in the service life of the non-volatile memory device, data states of the memory cells can still be distinguished between even when the read window 332-1 is used. A benefit of using a narrow read window, such as the read window 332-1, early in the service life of the non-volatile memory device can be reducing memory cell degradation early in the service life of the non-volatile memory device instead of using a wide read window, such as the read window 332-3, throughout the service life of the non-volatile memory device. Programming a memory cell to a greater $V_t$ (and subsequently erasing the memory cell) over many cycles can degrade the memory cell at a faster rate than programming the memory to a lower $V_t$ (and subsequently erasing the memory) early in the service life of the non-volatile memory device and increasing the $V_t$ throughout the service life of the non-volatile memory device in accordance with some embodiments of the present disclosure.

FIG. 3B illustrates graphical representations 333-1, 333-2, and 333-3 of degradation of memory cells in accordance with some embodiments of the present disclosure. The graphical representations 333-1, 333-2, and 333-3 described in connection with the read windows 332-1, 332-2, and 332-3 illustrated by FIG. 3A, respectively. Operating (e.g., programming and erasing) the memory cells of a non-volatile memory device can cause some memory cell degradation. How much a memory cell degrades can be a function of the quantity of PEC undergone by the memory cell (also referred to as the PEC count). As illustrated by FIGS. 3A-3B, as a memory cell undergoes an increasing quantity of PEC as illustrated by the transition from the read window 332-1 to the read window 332-2 and to the read window 332-3, degradation of the memory cell increases as illustrated by the transition from the graphical representation 333-1 to the graphical representation 333-2 and to the graphical representation 333-3.

As illustrated by FIG. 3A, some embodiments of the present disclosure include increasing the $V_t$ corresponding to the second data state as the non-volatile memory device undergoes more PEC. Programming the memory cells to a greater $V_t$ requires a greater voltage and/or increased number of voltage pulses to be applied to the memory cells, which can degrade the materials of the memory cells. During the middle of the service life of the non-volatile memory device, memory cells of the non-volatile memory device can be programmed to a greater $V_t$ corresponding to a desired data state. In response to the non-volatile memory undergoing further PEC, memory cells of the non-volatile memory device can be programmed to a greater $V_t$ corresponding to the data state 0 as illustrated by the read window 332-2.

During the latter portion of the service life of the non-volatile memory device, memory cells of the non-volatile memory device can be programmed to an even greater $V_t$ corresponding to a desired data state. In response to the non-volatile memory undergoing even further PEC, memory cells of the non-volatile memory device can be programmed to an even greater $V_t$ corresponding to the data state 0 as illustrated by the read window 332-3.

Deliberately programming memory cells to greater threshold voltages can cause additional degradation of the memory cells. However, memory cell degradation resulting from programming memory cells to greater threshold voltages can be much less than memory cell degradation resulting from PEC of memory cells. Programming a memory cell to greater threshold voltages based on the quantity of PEC that the memory cell has undergone (increasing the read window (for example, from the read window 332-1 to the read window 332-2 and/or the read window 332-3) based on the quantity of PEC that the memory cell has undergone) in accordance with some embodiments of the present disclosure can be beneficial to improve data retention of the memory cell.

In the example of FIG. 3A, the $V_t$ distribution corresponding to the data state 1 is static throughout the service life of the non-volatile memory device as illustrated by the read windows 332-1, 332-2, and 332-3. Because a target voltage corresponding to the data state 1 is static (unchanging), the $V_t$ distribution corresponding to the data state 1 illustrated as unchanging throughout the transition from the read window 332-1 to the read window 332-2 and to the read window 332-3.

In contrast the $V_t$ distribution corresponding to the data state 1, the $V_t$ distribution corresponding to the data state 0 is dynamic (changing) throughout the service life of the non-volatile memory device as illustrated by the read windows 332-1, 332-2, and 332-3. The $V_t$ distribution corresponding to the data state 0 is dynamic because a target voltage corresponding to the data state 0 is increased throughout the service life of a memory device based on a remaining service life of the memory device. In some embodiments of the present disclosure, a magnitude of a target voltage corresponding to the data state 0 can be increased continuously throughout the service life of the non-volatile memory device. For example, a magnitude of a target voltage can be increased continuously at one or more rates based on the remaining service life of the memory device and/or a quantity of PEC undergone by the non-volatile memory device. In some embodiments of the present disclosure, magnitudes of a target voltage corresponding to the data state 0 can be increased discretely throughout the service life of the non-volatile memory device. For example, a magnitude of a target voltage can be increased in response to a particular amount of remaining service life of the memory device and/or the non-volatile memory device undergoing a particular quantity of PEC.

Figure 5:
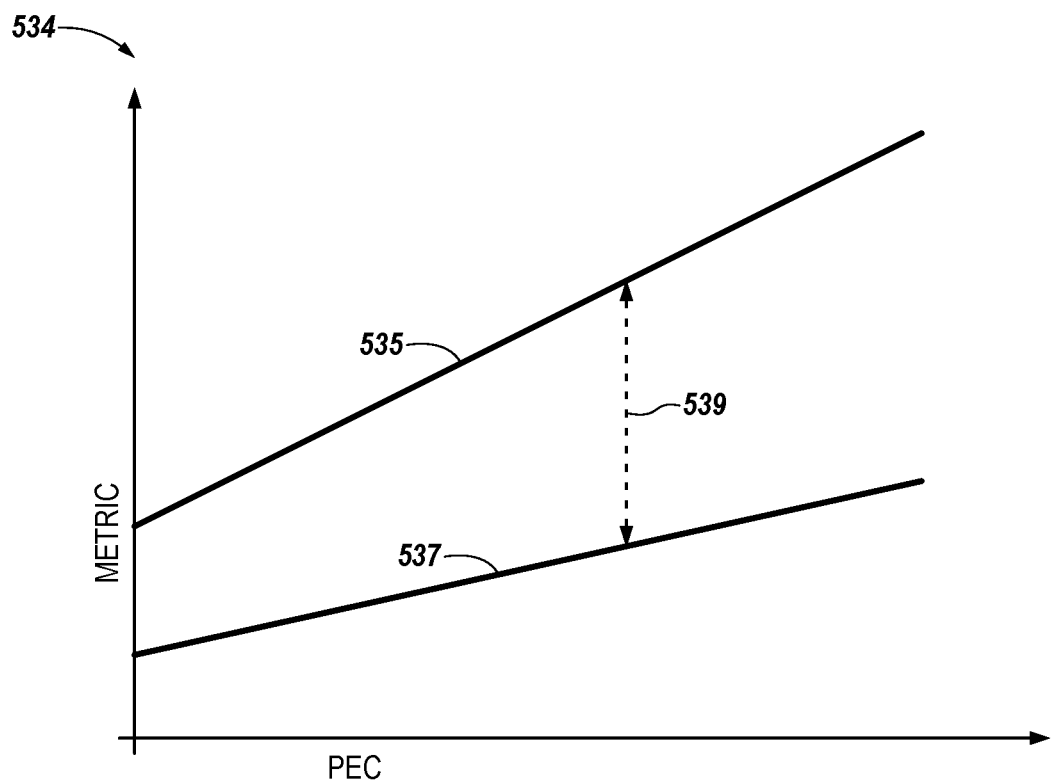
FIG. 5 is a plot demonstrating increasing a read window based on a quantity of PEC in accordance with some embodiments of the present disclosure.

In some embodiments of the present disclosure, a target voltage corresponding to the data state 1 can be decreased during at least a portion of the service life of the non-volatile memory device and a different target voltage corresponding to the data state 0 can be increased during at least a portion of the service life of the non-volatile memory device. In some embodiments of the present disclosure, an erase depth can be decreased to increase a read window. For example, during a latter portion of the service life of the non-volatile memory device, a magnitude of a voltage to erase one or more memory cells of the service life of the non-volatile memory device can be increased from a negative voltage to a less negative (more positive) voltage. FIG. 5 illustrates such an embodiment of the present disclosure.

In some embodiments of the present disclosure, an erase depth can be decreased during the service life of the memory device, or one or more portions thereof. In some embodiments of the present disclosure, an erase depth can remain constant during the service life of the memory device, or one or more portions thereof. In some embodiments of the present disclosure, a $V_t$ distribution corresponding to a programmed state (e.g., data state 0) can be modulated with respect to the erase depth based on the quantity of PEC undergone by the memory device.

FIG. 3A illustrates read windows for programming in SLC mode. However, embodiments of the present disclosure are not so limited. For example, embodiments of the present disclosure can include programming a memory cell in MLC mode, TLC mode, QLC mode, or PLC mode. A memory cell can be programmed in MLC mode to a $V_t$ corresponding to a desired data state during a portion of a service life of the non-volatile memory device and another, greater $V_t$ corresponding to the desired data state during another portion of the service life of the non-volatile memory device. During the portion of the service life of the non-volatile memory device, the memory cell can be programmed to a $V_t$ corresponding to another desired data state. During the other portion of the service life of the non-volatile memory device, an MLC of the non-volatile memory device can be programmed to another, greater $V_t$ corresponding to the data state.

Figure 4:
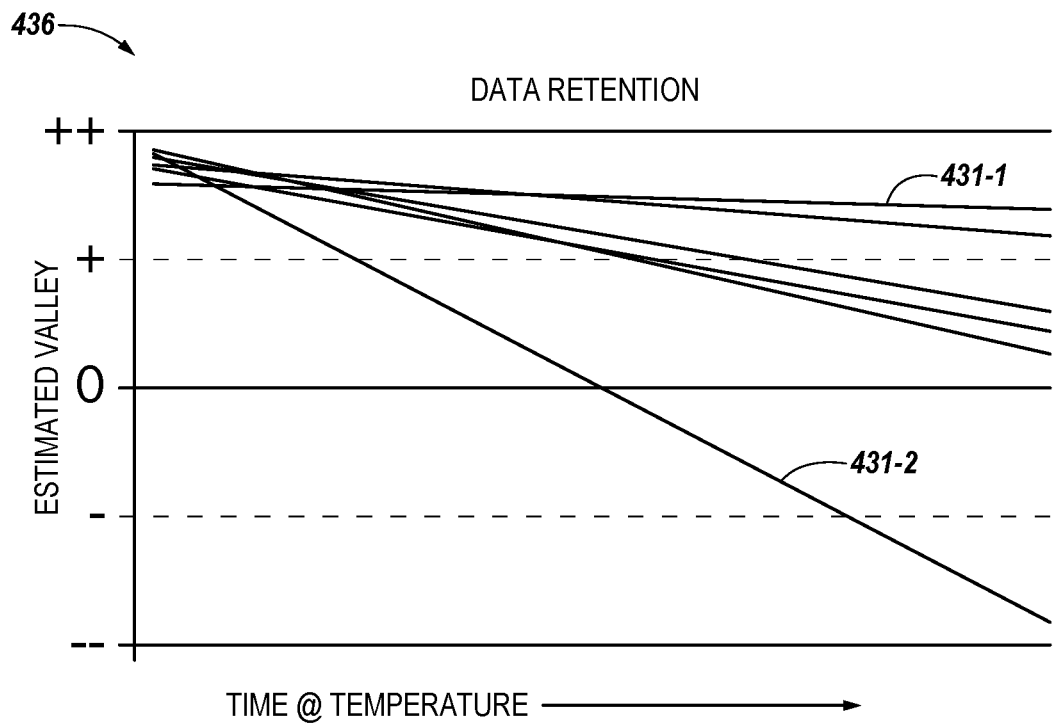
FIG. 4 is a plot indicating data retention in accordance with some embodiments of the present disclosure.

FIG. 4 is a plot 436 indicating data retention in accordance with some embodiments of the present disclosure. The vertical axis of the plot 436 indicates a location of the valley between $V_t$ distributions for an SLC. The location of the valley is also referred to as the read window or $V_t$ spread. Zero volts is shown at the center of the vertical axis with the voltage increasing from zero (indicated by +, ++) and decreasing voltage from zero (indicated by -, --). The voltage scale of the vertical axis is linear. The horizontal axis of the plot 436 indicates the passage of time at a test temperature with time increasing toward the right side of the plot 436. The time scale is logarithmic and begins on the left at zero and progresses through several months toward the right in the plot 436.

Each of the lines on the plot 436 represents the data retention capability of an SLC as indicated by the estimated valley during the service life of the SLC for a respective quantity of PEC that the SLC has undergone. For example, line 431-1 represents the data retention capability of an SLC that has undergone a first quantity of PEC during the service life of the SLC and line 431-2 represents the data retention capability of an SLC that has undergone a second, greater quantity of PEC during the service life of the SLC. The quantity of PEC that the SLC has undergone increases in the downward direction on the plot 436. As illustrated by the plot 436, the data retention capability of the SLC decreases significantly as the PEC increase.

FIG. 5 is a plot 534 demonstrating increasing a read window 539 based on a quantity of PEC in accordance with some embodiments of the present disclosure. The horizontal axis of plot 534 indicates a quantity of PEC with the quantity of PEC increasing toward the right side of the plot 534. The vertical axis of the plot 534 indicates a location of the valley between $V_t$ distributions for a memory device. The location of the valley is also referred to as the read window or $V_t$ spread.

Line 535 represents program verify voltages. A program verify voltage is used to confirm that a memory cell has been programmed to at least a $V_t$ corresponding to a programmed state. A magnitude of a program verify voltage can be less than a target voltage corresponding to the programmed state. A magnitude of a program verify voltage corresponds to the lesser side of a $V_t$ distribution.

Line 537 represents erase verify voltages. An erase verify voltage is used to confirm that a memory cell has been erased to at least $V_t$ corresponding to an erased state. A magnitude of an erase verify voltage can be greater than a target voltage corresponding to the programmed state. A magnitude of an erase verify voltage corresponds to the greater side of a $V_t$ distribution.

In some embodiments of the present disclosure, a memory cell can be programmed to a greater $V_t$ during a latter portion of a service life of a memory device by increasing a magnitude of a program verify voltage. For example, the memory cell can undergo a quantity of program voltage pulses and subsequently a program verify voltage can be applied to the memory cell to confirm that the memory cell has sufficiently programmed. If the memory cell conducts as a result of application of the program verify voltage, then the memory cell passes. If the memory cell does not conduct as a result of application of the program verify voltage, then one or more additional program voltage pulses can be applied to the memory cell.

In some embodiments of the present disclosure, a memory cell can be programmed to a greater $V_t$ during a latter portion of a service life of a memory device by increasing a magnitude of an erase verify voltage. Increasing a magnitude of an erase verify voltage can effectively relax the program verify voltage requirement discussed above. Increasing a magnitude of the erase verify voltage can cause the memory cell to be erased shallowly (to such a low or negative voltage) can make it easier for the memory cell to be reach to a low voltage so as to be considered to be erased. As the memory cell ages, it can become difficult to erase the memory cell to such low or negative voltages due to degradation of the memory cell. As described herein, an erase depth can be increased, decreased, and/or constant during the service life of the memory device, or one or more portions thereof.

Figure 6:
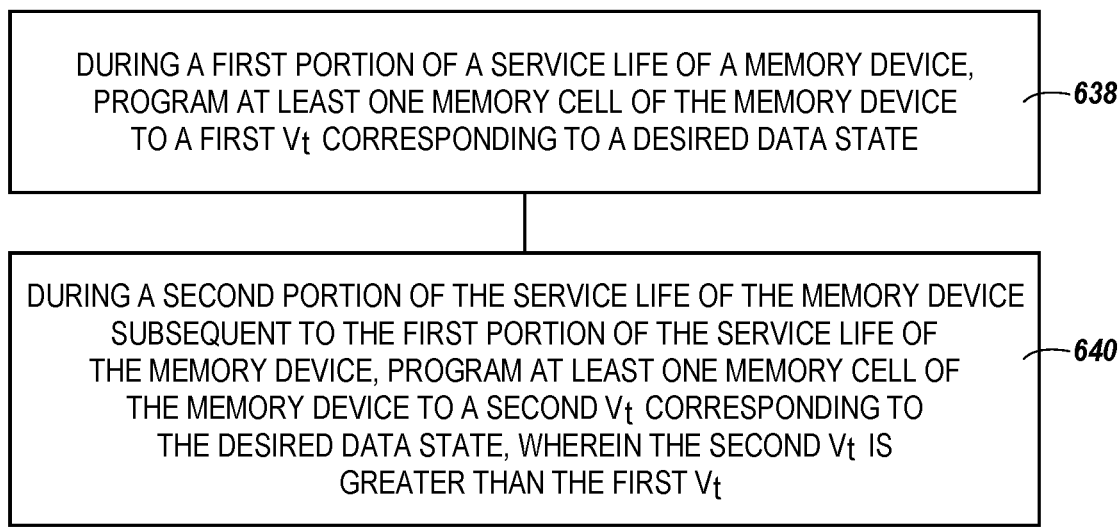
FIG. 6 is a flow diagram of an example method for programming memory cells of a memory device to a $V_t$ corresponding to a desired data state based on a remaining service life of the memory device in accordance with some embodiments of the present disclosure.

FIG. 6 is a flow diagram of an example method for programming memory cells of a memory device to a threshold voltage corresponding to a desired data state based on a remaining service life of the memory device in accordance with some embodiments of the present disclosure. The method can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method is performed by or using the memory sub-system controller 106, processing device 108, valley circuitry 112, non-volatile memory device 116 and/or volatile memory device 114, and/or local media controller 118 shown in FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 638, during a portion of a service life of a memory device (e.g., the non-volatile memory device 116 illustrated in FIG. 1), one or more memory cells of the memory device can be programmed to a $V_t$ corresponding to a desired data state At operation 640, during a subsequent portion of the service life of the memory device, one or more memory cells of the memory device can be programmed to a different $V_t$ corresponding to the desired data state.

In some embodiments, the desired data state can be a programmed state and the different $V_t$ can be greater than the $V_t$. In some embodiments, the desired data state can be an erased state and the different $V_t$ can be less than or more negative than the $V_t$. In some embodiments, during the first portion of the service life, one or more memory cells can be programmed to another $V_t$ corresponding to an erased state and, during the second portion of the service life, one or more memory cells can be programmed to another, lesser or more negative $V_t$ corresponding to the erased state.

In some embodiments, during another subsequent portion of the service life of the memory device, one or more memory cells of the memory device can be programmed to an even greater $V_t$ corresponding to the desired data state. One or more memory cells of the memory device can be programmed to the $V_t$ in response to the memory device undergoing less than a particular quantity of PEC and programming one or more memory cells of the memory device to the greater $V_t$ in response to the memory device undergoing at least the particular quantity of PEC. Some embodiments can include transitioning from programming one or more memory cells of the memory device to the $V_t$ to programming one or more memory cells of the memory device to the greater $V_t$ based on a remaining service life of the memory device.

In some embodiments, one or more memory cells of the memory device can be an MLC. The MLC can be programmed to a $V_t$ corresponding to a different desired data state and during a subsequent portion of the service life of the memory device, the MLC can be programmed to a greater $V_t$ corresponding to the different data state.

Figure 7:
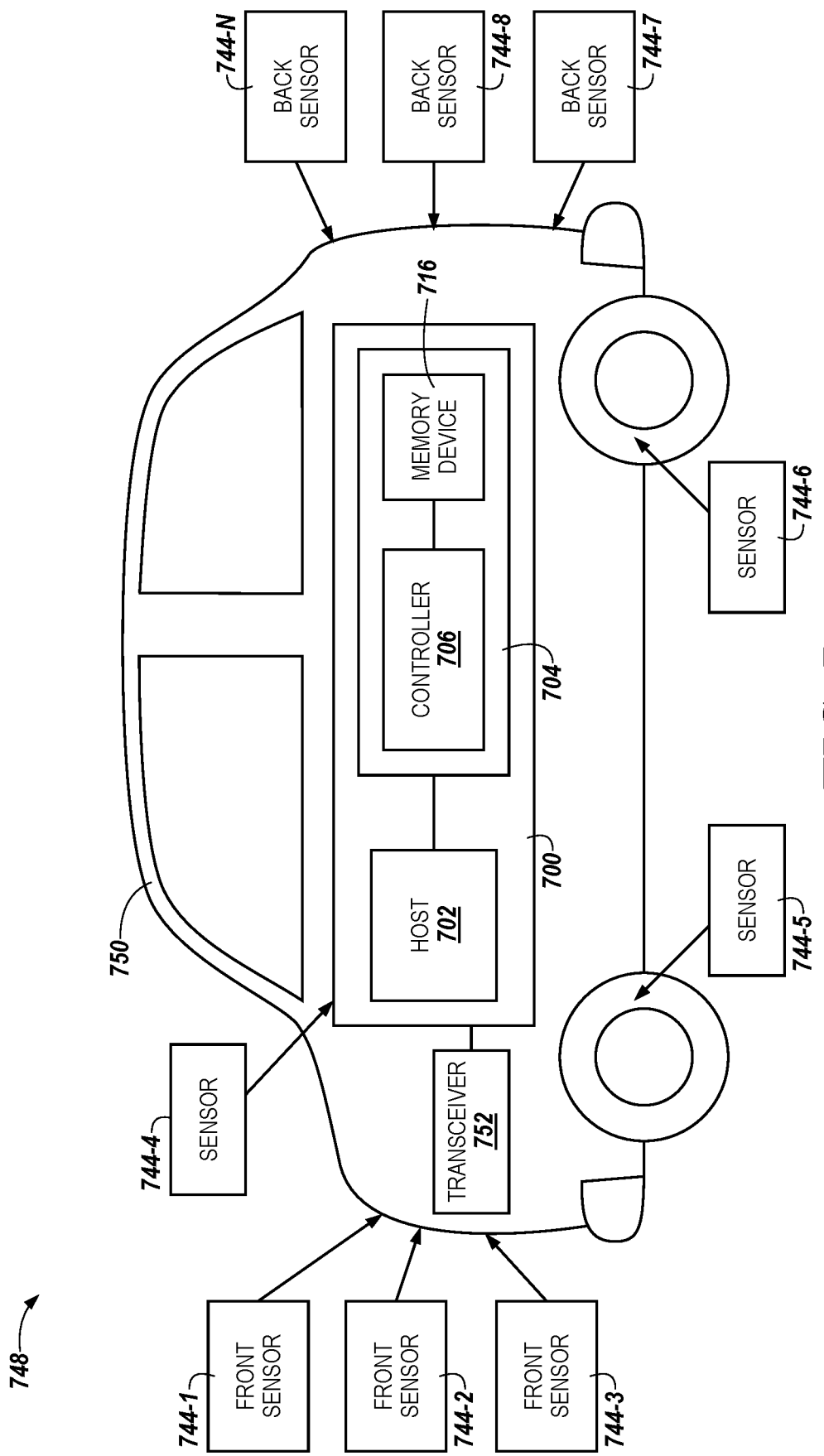
FIG. 7 illustrates an example of a system including a computing system in a vehicle in accordance with some embodiments of the present disclosure.

FIG. 7 illustrates an example of a system 748 including a computing system 700 in a vehicle 750 in accordance with some embodiments of the present disclosure. The computing system 700 can include a memory sub-system 704, which is illustrated as including a controller 706 and non-volatile memory device 716 for simplicity but is analogous to the memory sub-system 704 illustrated in FIG. 1. The computing system 700, and thus the host 702, can be coupled to a number of sensors 744 either directly, as illustrated for the sensor 744-4 or via a transceiver 752 as illustrated for the sensors 744-1, 744-2, 744-3, 744-5, 744-6, 744-7, 744-8, . .

. 744-N. The transceiver 752 is able to receive time based telemetric sensor data from the sensors 744 wirelessly, such as by radio frequency communication. In at least one embodiment, each of the sensors 744 can communicate with the computing system 700 wirelessly via the transceiver 752. In at least one embodiment, each of the sensors 744 is connected directly to the computing system 700 (e.g., via wires or optical cables). As used herein, telemetric sensor data means that the data is collected by sensors 744 that are remote from the memory sub-system 704 that stores the data (the receiving equipment). The telemetric sensor data is time based because the data is correlated with time. The time corresponding to each data point can either be stored with the telemetric data or derivable therefrom based on some metric, such as a known start time for the data and a data rate. The time can be useful in the playback of the sequences preceding an accident, for example.

The vehicle 750 can be a car (e.g., sedan, van, truck, etc.), a connected vehicle (e.g., a vehicle that has a computing capability to communicate with an external server), an autonomous vehicle (e.g., a vehicle with self-automation capabilities such as self-driving), a drone, a plane, a ship, and/or anything used for transporting people and/or goods. The sensors 744 are illustrated in FIG. 7 as including example attributes. For example, sensors 744-1, 744-2, and 744-3 are camera sensors collecting data from the front of the vehicle 750. Sensors 744-4, 744-5, and 744-6 are microphone sensors collecting data from the from the front, middle, and back of the vehicle 750. The sensors 744-7, 744-8, and 744-N are camera sensors collecting data from the back of the vehicle 750. As another example, the sensors 744-5 and 744-6 are tire pressure sensors. As another example, the sensor 744-4 is a navigation sensor, such as a global positioning system (GPS) receiver. As another example, the sensor 744-6 is a speedometer. As another example, the sensor 744-4 represents a number of engine sensors such as a temperature sensor, a pressure sensor, a voltmeter, an ammeter, a tachometer, a fuel gauge, etc. As another example, the sensor 744-4 represents a video camera.

The host 702 can execute instructions to provide an overall control system and/or operating system for the vehicle 750. The host 702 can be a controller designed to assist in automation endeavors of the vehicle 750. For example, the host 702 can be an advanced driver assistance system controller (ADAS). An ADAS can monitor data to prevent accidents and provide warning of potentially unsafe situations. For example, the ADAS can monitor sensors in the vehicle 750 and take control of vehicle 750 operations to avoid accident or injury (e.g., to avoid accidents in the case of an incapacitated user of a vehicle). The host 702 may need to act and make decisions quickly to avoid accidents. The memory sub-system 704 can store reference data in the non-volatile memory device 716 such that time based telemetric sensor data from the sensors 744 can be compared to the reference data by the host 702 in order to make quick decisions.

Figure 8:
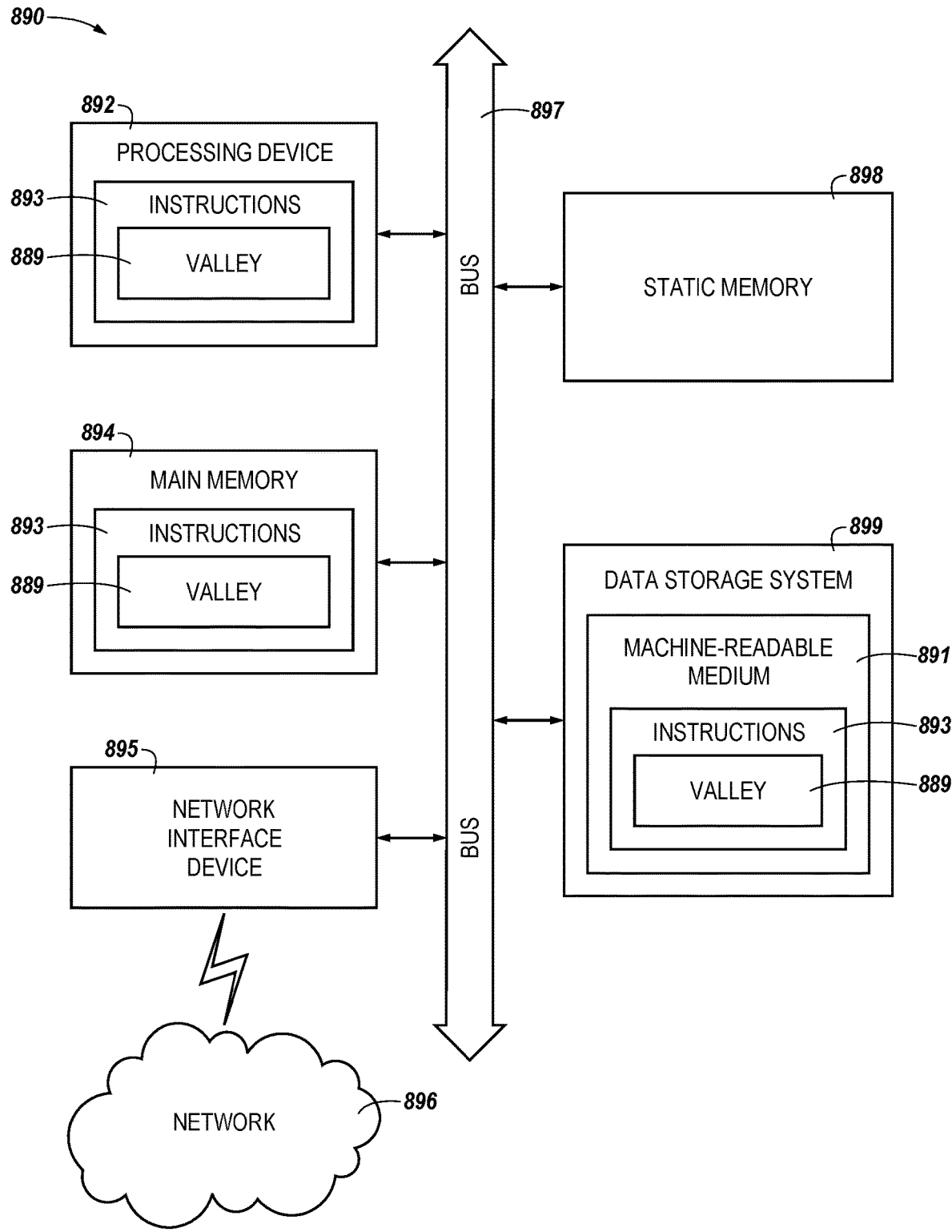
FIG. 8 is a block diagram of an example computer system in which embodiments of the present disclosure can operate.

FIG. 8 is a block diagram of an example computer system 890 in which embodiments of the present disclosure can operate. Within the computer system 890, a set of instructions, for causing a machine to perform one or more of the methodologies discussed herein, can be executed. The computer system 890 includes a processing device 892, a main memory 894, a static memory 898 (e.g., flash memory, static random access memory (SRAM), etc.), and a data storage system 899, which communicate with each other via a bus 897. The data storage system 899 is analogous to the memory sub-system 104 illustrated in FIG. 1.

The processing device 892 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 892 can also be one or more special-purpose processing devices such as an ASIC, an FPGA, a digital signal processor (DSP), network processor, or the like. The processing device 892 is configured to execute instructions 893 for performing the operations and steps discussed herein. The computer system 890 can further include a network interface device 895 to communicate over a network 896.

The data storage system 899 can include a machine-readable storage medium 891 (also known as a computer-readable medium) on which is stored one or more sets of instructions 893 or software embodying one or more of the methodologies or functions described herein. The instructions 893 can also reside, completely or at least partially, within the main memory 894 and/or within the processing device 892 during execution thereof by the computer system 890, the main memory 894, and the processing device 892 also constituting machine-readable storage media.

In one embodiment, the instructions 893 include instructions to implement functionality corresponding to the valley circuitry 112 of FIG. 1. The instructions 893 can include instructions to different valley 889 locations based on a remain service life of a memory sub-system. The instructions 893 can include instructions to, responsive to a quantity of PEC undergone by the memory sub-system being at most a first value, program one or more memory cells of the memory sub-system to a $V_t$ corresponding to a desired data state with a relatively small read window. The instructions 893 can further be executed to responsive to the quantity of PEC undergone by the memory sub-system being greater than the value and at most another value, program one or more memory cells of the memory sub-system to a different $V_t$ corresponding to the desired data state with a relatively large read window. In at least one embodiment of the present disclosure, the desired data state can correspond to a programmed state. The relatively small read window can be such that a magnitude of the $V_t$ is relatively close to a magnitude of another $V_t$ corresponding to an erased state. The instructions 893 can be executed to program one or more memory cells of the memory sub-system to the different $V_t$ with the relatively small read window early in a service life of the memory sub-system to reduce degradation of the at least one memory cell. The instructions 893 can be executed to enlarge a read window throughout a service life of the memory sub-system to improve data retention of one or more memory cells of the memory sub-system near an end of the service life. The instructions 893 can be executed to enlarge a read window based on the quantity of PEC undergone by the memory sub-system. The instructions 893 can be executed to responsive to the quantity of PEC undergone by the memory sub-system being greater than the other value, program one or more memory cells of the memory sub-system to a $V_t$ corresponding to the desired data state with another relatively large read window that is larger than the relatively large read window.

While the machine-readable storage medium 891 is shown in an example embodiment to be a single medium, the term "machine-readable storage medium" should be taken to include a single medium or multiple media that store the one or more sets of instructions. The term "machine-readable storage medium" shall also be taken to include a medium that is capable of storing or encoding a set of instructions for execution by the machine and that cause the machine to perform one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, types of disk including floppy disks, optical disks, CD-ROMs, and magnetic-optical disks, ROMs, RAMs, EPROMs, EEPROMs, magnetic or optical cards, or type of media suitable for storing electronic instructions, each coupled to a computer system bus.

The algorithms and displays presented herein are not inherently related to a particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to a particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   in response to a memory device operating in a first portion of a service life of the memory device, programming at least one memory cell of the memory device to a first particular threshold voltage corresponding to a desired data state, wherein the first portion of the service life is defined by a program erase cycles (PEC) count from zero to a threshold PEC count; and
   in response to the memory device operating in a second portion of the service life, programming at least one memory cell of the memory device to a second particular threshold voltage corresponding to the desired data state, wherein the second portion of the service life is defined by a PEC count greater than the threshold PEC count,
   wherein the threshold PEC count, the first particular threshold voltage, the second particular threshold voltage, the first portion of service life, and the second portion of service life are determined prior to initiation of the service life and without reading a threshold voltage of the memory device,
   wherein the second portion of the service life is subsequent to the first portion of the service life, and
   wherein the second particular threshold voltage is different than the first particular threshold voltage.

2. The method of claim 1, wherein the desired data state is a programmed state, and
   wherein the second particular threshold voltage is greater than the first particular threshold voltage.

3. The method of claim 2, further comprising:
   during the first portion of the service life of the memory device, programming the at least one memory cell to a third particular threshold voltage corresponding to an erased state; and
   during the second portion of the service life of the memory device, programming the at least one memory cell to a fourth particular threshold voltage corresponding to the erased state,
   wherein the fourth particular threshold voltage is less than or more negative than the third particular threshold voltage.

4. The method of claim 1, wherein the desired data state is an erased state, and
   wherein the second particular threshold voltage is less than or more negative than the first particular threshold voltage.

5. The method of claim 1, further comprising, during a third portion of the service life of the memory device subsequent to the second portion of the service life of the memory device, programming the at least one memory cell of the memory device to a third particular threshold voltage corresponding to the desired data state,
wherein the third particular threshold voltage is greater than the second particular threshold voltage.

6. The method of claim 1, wherein at least one memory cell of the memory device is to store more than one bit, and wherein the method further comprises:
during the first portion of the service life of the memory device, programming the at least one memory cell to a third particular threshold voltage corresponding to a different desired data state; and
during the second portion of the service life of the memory device, programming the at least one memory cell to a fourth particular threshold voltage corresponding to the different data state,
wherein the fourth particular threshold voltage is greater than the third particular threshold voltage, and
wherein the third particular threshold voltage is greater than the second particular threshold voltage.

7. A system, comprising:
a processing device; and
a memory device communicatively coupled to the processing device,
wherein the processing device is to:
responsive to the memory device operating in a first portion of a service life of the memory device, programming at least one memory cell of the memory device to a first particular threshold voltage corresponding to a desired data state, wherein the first portion of the service life is defined by a program erase cycles (PEC) count from zero to a threshold PEC count;
responsive to the memory device operating in a second portion of the service life, programming at least one memory cell of the memory device to a second particular threshold voltage corresponding to the desired state, wherein the second portion of service life is defined by a PEC count greater than the threshold PEC count,
wherein the threshold PEC count, the first particular threshold voltage, the second particular threshold voltage, the first portion of the service life, and the second portion of service life are determined prior to initiation of the service life and without reading a threshold voltage of the memory device, and
wherein the second portion of the service life is subsequent to the first portion of the service life.

8. The system of claim 7, wherein the processing device is to:
responsive to the memory device operating in the first portion of the service life, program at least one memory cell of the memory device to a third particular threshold voltage corresponding to an erased state; and
responsive to the memory device operating in the second portion of service life, program at least one memory cell of the memory device to a fourth particular threshold voltage corresponding to the erased state, wherein the fourth particular threshold voltage is more negative than the third particular threshold voltage.

9. The system of claim 7, wherein the desired state is a programmed state.

10. The system of claim 7, wherein the system comprises a solid state drive to provide event recorder storage for an autonomous vehicle.

11. A non-transitory computer-readable storage medium comprising instructions that, when executed by a processing device, cause the processing device to:
responsive to a memory device operating in a first portion of a service life, program at least one memory cell of the memory device to a first particular threshold voltage corresponding to a desired data state with a relatively small read window,
wherein the first portion of the service life is defined by a program erase cycles (PEC) count from zero to a threshold PEC count; and
responsive to the memory device operating in a first portion of a service life, program at least one memory cell of the memory device to a second particular threshold voltage corresponding to the desired data state with a relatively large read window,
wherein the second portion of service life is defined by a PEC count greater than the threshold PEC count, and
wherein the threshold PEC count, the first particular threshold voltage, the second particular threshold voltage, the first portion of the service life, and the second portion of service life are determined prior to initiation of the service life and without reading a threshold voltage of the memory device.

12. The medium of claim 11, wherein the desired data state corresponds to a programmed state, and
wherein the relatively small read window is such that a magnitude of the first particular threshold voltage is relatively close to a magnitude of a third particular threshold voltage corresponding to an erased state.

13. The medium of claim 12, further comprising instructions to program at least one memory cell of the memory device to the second particular threshold voltage with the relatively small read window within the first portion of the service life of the memory device to reduce degradation of the at least one memory cell,
wherein the first portion of the service life is early in the service life.

14. The medium of claim 11, further comprising instructions to enlarge a read window in the second portion of service life of the memory device to improve data retention of at least one memory cell of the memory device near an end of the service life of the memory device.

15. The medium of claim 11, wherein the first particular threshold voltage is different from the second particular threshold voltage.

16. The medium of claim 11, further comprising instructions to, responsive to the memory device operating in the first portion of the service life, program at least one memory cell of the memory device to a third particular threshold voltage corresponding to an erased state; and
responsive to the memory device operating in the second portion of service life, programming the at least one memory cell to a fourth particular threshold voltage corresponding to the erased state,
wherein the fourth particular threshold voltage is more negative than the third particular threshold voltage.

* * * * *